(12) United States Patent
Miki et al.

(10) Patent No.: US 10,903,407 B2
(45) Date of Patent: Jan. 26, 2021

(54) SEMICONDUCTOR LIGHT EMITTING ELEMENT

(71) Applicant: Nichia Corporation, Anan (JP)

(72) Inventors: Yasuhiro Miki, Tokushima (JP); Koichi Takenaga, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/526,895

(22) Filed: Jul. 30, 2019

(65) Prior Publication Data

US 2020/0044128 A1 Feb. 6, 2020

(30) Foreign Application Priority Data

Jul. 31, 2018 (JP) ................................. 2018-143113

(51) Int. Cl.
*H01L 33/38* (2010.01)
*H01L 33/62* (2010.01)
*H01L 33/36* (2010.01)

(52) U.S. Cl.
CPC .............. *H01L 33/62* (2013.01); *H01L 33/36* (2013.01)

(58) Field of Classification Search
CPC ........ H01L 33/387; H01L 33/36; H01L 33/62
See application file for complete search history.

(56) References Cited

U.S. PATENT DOCUMENTS

| 9,887,334 | B1 | 2/2018 | Jeon et al. | |
| 10,181,550 | B2* | 1/2019 | Seong | H01L 33/007 |
| 2003/0136965 | A1* | 7/2003 | Lee | H01L 33/38 |
| | | | | 257/79 |
| 2006/0081865 | A1* | 4/2006 | Sakamoto | H01L 33/38 |
| | | | | 257/98 |
| 2007/0023771 | A1* | 2/2007 | Kim | H01L 33/387 |
| | | | | 257/94 |
| 2007/0085095 | A1* | 4/2007 | Ko | H01L 33/38 |
| | | | | 257/94 |
| 2008/0096297 | A1 | 4/2008 | Schiaffino et al. | |

(Continued)

FOREIGN PATENT DOCUMENTS

| JP | 2010-507246 A | 3/2010 |
| JP | 2012-049366 A | 3/2012 |

(Continued)

*Primary Examiner* — Errol V Fernandes
(74) *Attorney, Agent, or Firm* — Foley & Lardner LLP

(57) ABSTRACT

A semiconductor light emitting element includes a semiconductor layered body including an n-side semiconductor layer and a p-side semiconductor layer disposed above the n-side semiconductor layer, an insulating film defining a plurality of first n-side openings on the n-side semiconductor layer in an inner region and a plurality of second n-side openings on an outer peripheral region of the n-side semiconductor layer, an n-electrode disposed extending over the insulating film and the outer peripheral region of the n-side semiconductor layer and including: a plurality of first n-contact portions, each electrically connected with the n-side semiconductor layer through a respective one of the first n-side openings, and a plurality of second n-contact portions, each electrically connected with the n-side semiconductor layer through a respective one of the second n-side openings, at at least four corners of the outer peripheral region of the n-side semiconductor layer.

16 Claims, 12 Drawing Sheets

(56) References Cited

U.S. PATENT DOCUMENTS

| | | | |
|---|---|---|---|
| 2012/0049223 A1* | 3/2012 | Yang | H01L 33/385 |
| | | | 257/98 |
| 2012/0049236 A1 | 3/2012 | Kamiya et al. | |
| 2013/0292645 A1* | 11/2013 | Yun | H01L 33/14 |
| | | | 257/13 |
| 2014/0183586 A1* | 7/2014 | Kamiya | H01L 33/60 |
| | | | 257/98 |
| 2015/0311415 A1 | 10/2015 | Song et al. | |
| 2016/0225956 A1 | 8/2016 | Kawai et al. | |
| 2016/0260869 A1* | 9/2016 | Jeon | H01L 33/38 |
| 2016/0343926 A1 | 11/2016 | Kageyama | |
| 2017/0294557 A1* | 10/2017 | Chen | H01L 33/32 |
| 2017/0365738 A1* | 12/2017 | Takenaga | H01L 33/382 |
| 2018/0069154 A1* | 3/2018 | Dobrinsky | H01L 33/025 |
| 2018/0182929 A1 | 6/2018 | Ozeki et al. | |
| 2020/0176635 A1* | 6/2020 | Wei | H01L 33/44 |

FOREIGN PATENT DOCUMENTS

| | | |
|---|---|---|
| JP | 2016-032009 A | 3/2016 |
| JP | 2016-143682 A | 8/2016 |
| JP | 2016-219787 A | 12/2016 |
| JP | 2017-135348 A | 8/2017 |
| JP | 2018-107371 A | 7/2018 |

\* cited by examiner

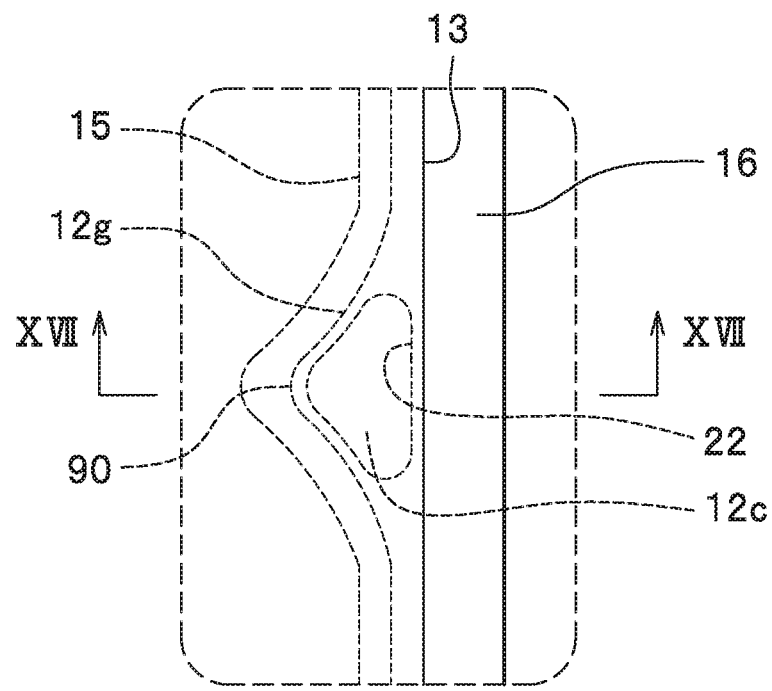
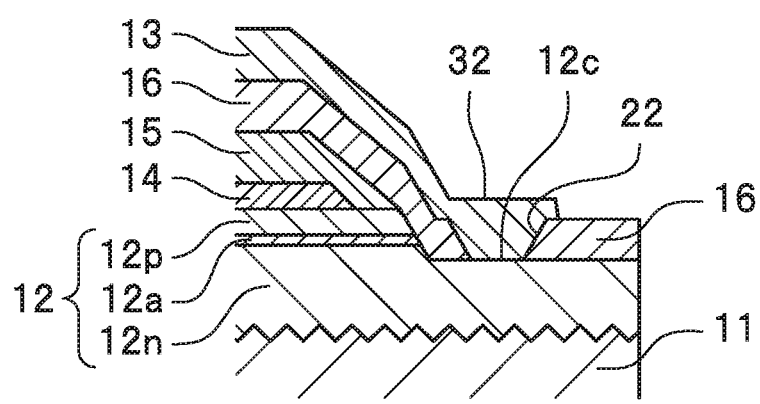

SEMICONDUCTOR LIGHT EMITTING ELEMENT

CROSS-REFERENCE TO RELATED APPLICATIONS

This application claims priority to Japanese Patent Application No. 2018-143113, filed on Jul. 31, 2018, the entire contents of which are incorporated herein by reference.

BACKGROUND

1. Technical Field

The present disclosure relates to a semiconductor light emitting element.

2. Description of Related Art

Flip-chip-mounted semiconductor light emitting elements are known (see, for example, JP 2017-135348 A). The semiconductor light emitting element described in JP 2017-135348 A includes, as electrodes for external connection, a p-pad electrode electrically connected to a p-side semiconductor layer of a semiconductor layered body and disposed at the central region of the semiconductor light emitting element in a top view, and n-electrodes disposed on both sides of the p-pad electrode. In the semiconductor light emitting element, the n-pad electrode includes a plurality of n-contact portions dispersedly disposed in regions excluding the p-pad electrode and an outer peripheral region of an n-side semiconductor layer. The n-contact portions are electrically connected to the n-side semiconductor layer of the semiconductor layered body. This structure allows for increasing the number of n-contact portions, so that rising of a forward voltage Vf of the semiconductor light emitting element can be inhibited.

SUMMARY

Increase of the area of electrical connection between an n-electrode and an n-type semiconductor layer for reducing a forward voltage Vf generally allows for, for example, reducing the area (i.e., region) of an active layer of a semiconductor layered body, resulting in reduction of a light emission output. In addition, some arrangement patterns of a plurality of n-contact portions in a top view of the semiconductor layered body may cause unevenness in current density distribution.

Certain embodiments of the present disclosure allow for obtaining a semiconductor light emitting element in which light emission output can be improved while reducing a forward voltage, and unevenness of a current density distribution can be reduced.

According to one embodiment, a semiconductor light emitting element includes a semiconductor layered body having a substantially rectangular shape in a top view, the semiconductor layered body including an n-side semiconductor layer including an outer peripheral region and an inner region excluding the outer peripheral region, and a p-side semiconductor layer disposed above the n-side semiconductor layer in the inner region; an insulating film defining, on the semiconductor layered body: a p-side opening above the p-side semiconductor layer, a plurality of first n-side openings on the n-side semiconductor layer in the inner region, and a plurality of second n-side openings on the outer peripheral region of the n-side semiconductor layer; an n-electrode disposed extending over the insulating film and the outer peripheral region of the n-side semiconductor layer, and including: a plurality of first n-contact portions each electrically connected with the n-side semiconductor layer through a respective one of the first n-side openings, and a plurality of second n-contact portions, each electrically connected with the n-side semiconductor layer through a respective one of the second n-side openings, at at least four corners of the outer peripheral region of the n-side semiconductor layer; and a p-pad electrode electrically connected with the p-side semiconductor layer through the p-side opening, disposed in a region including a central portion of the semiconductor layered body in a top view, extending in a direction parallel to a first side of the semiconductor layered body such that two opposite ends of the p-pad electrode is located in proximity to the outer peripheral region of the n-side semiconductor layer in a top view, and disposed such that the p-pad electrode divides the semiconductor layered body into a first region and a second region in a top view. Each of the first region and the second region includes a first section positioned at a p-pad electrode side, and a second section positioned at an outer peripheral region side of the semiconductor layered body between the p-pad electrode and the outer peripheral region of the semiconductor layered body in a direction perpendicular to a first side of the semiconductor layered body, such that each of the first region and the second region is halved into the first section and the second section. The second section of each of the first region and the second region includes a first segment, a third segment, and a second segment positioned between the first segment and the third segment, such that the second section is trisected into the first to third segments in a direction parallel to the first side of the semiconductor layered body. An area of the first n-contact portions in the first section of each of the first region and the second region is larger than an area of the first n-contact portions in the second section of a respective one of the first region and the second region. An area of the first n-contact portions in the second segment of each of the first region and the second region is larger than an area of the first n-contact portions in the first segment and third segment of a respective one of the first region and the second region.

According to certain embodiments of the present disclosure, light emission output can be improved while reducing a forward voltage, and in-plane unevenness of a current density distribution can be reduced.

BRIEF DESCRIPTION OF THE DRAWINGS

FIG. 16 is a schematic plan view illustrating the configuration of the semiconductor light emitting element according to the second embodiment, showing an enlarged view of a region XVI indicated by a two-dot chain line in FIG. 15.

FIG. 17 is a schematic cross-sectional view illustrating the configuration of the semiconductor light emitting element according to the second embodiment, showing a cross-section taken along line XVII-XVII in FIG. 16.

DETAILED DESCRIPTION

Figure 1:
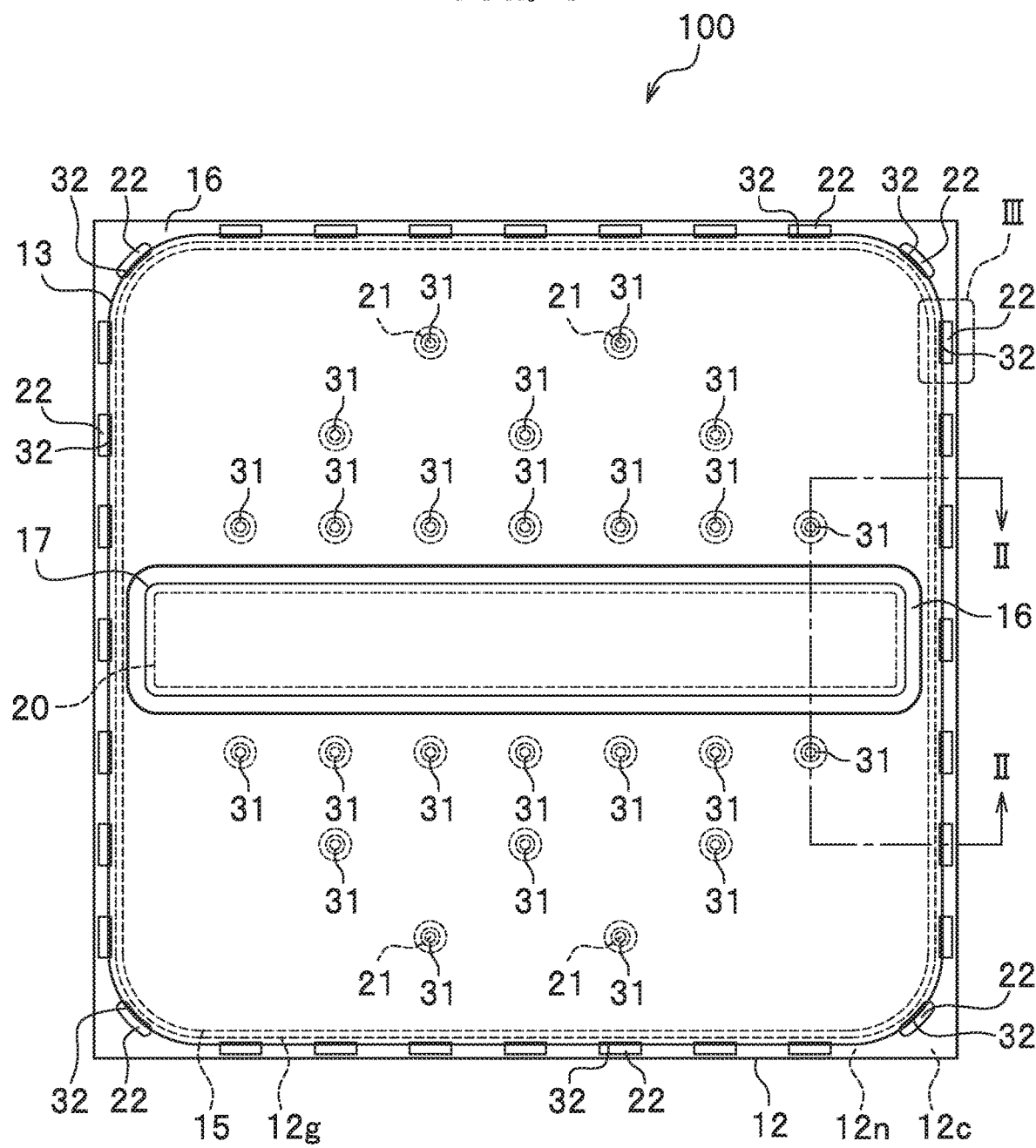
FIG. 1 is a plan view schematically illustrating a configuration of a semiconductor light emitting element according to a first embodiment.

Semiconductor light emitting elements according to certain embodiments of the present disclosure will be described below.

The drawings referred to in the following description schematically illustrate embodiments of the present disclosure, and therefore, scales, spacings and positional relations of members may be exaggerated, or portions of members may be omitted. In addition, scales and spacings of members may be inconsistent among plan views and cross-sectional views. In addition, in the description below, the same names and symbols indicate the same or similar members, and detailed descriptions thereof may be omitted as appropriate.

Further, in the present disclosure, positions such as "upper" and "lower" "left" and "right" and the like may be inverted with one another according to the situation. In this specification, "upper", "lower" and the like indicate relative positions among constituent elements in the drawings referred to for description, and are not intended to indicate absolute positions unless otherwise specified.

First Embodiment

Configuration of Semiconductor Light Emitting Element

Figure 8:
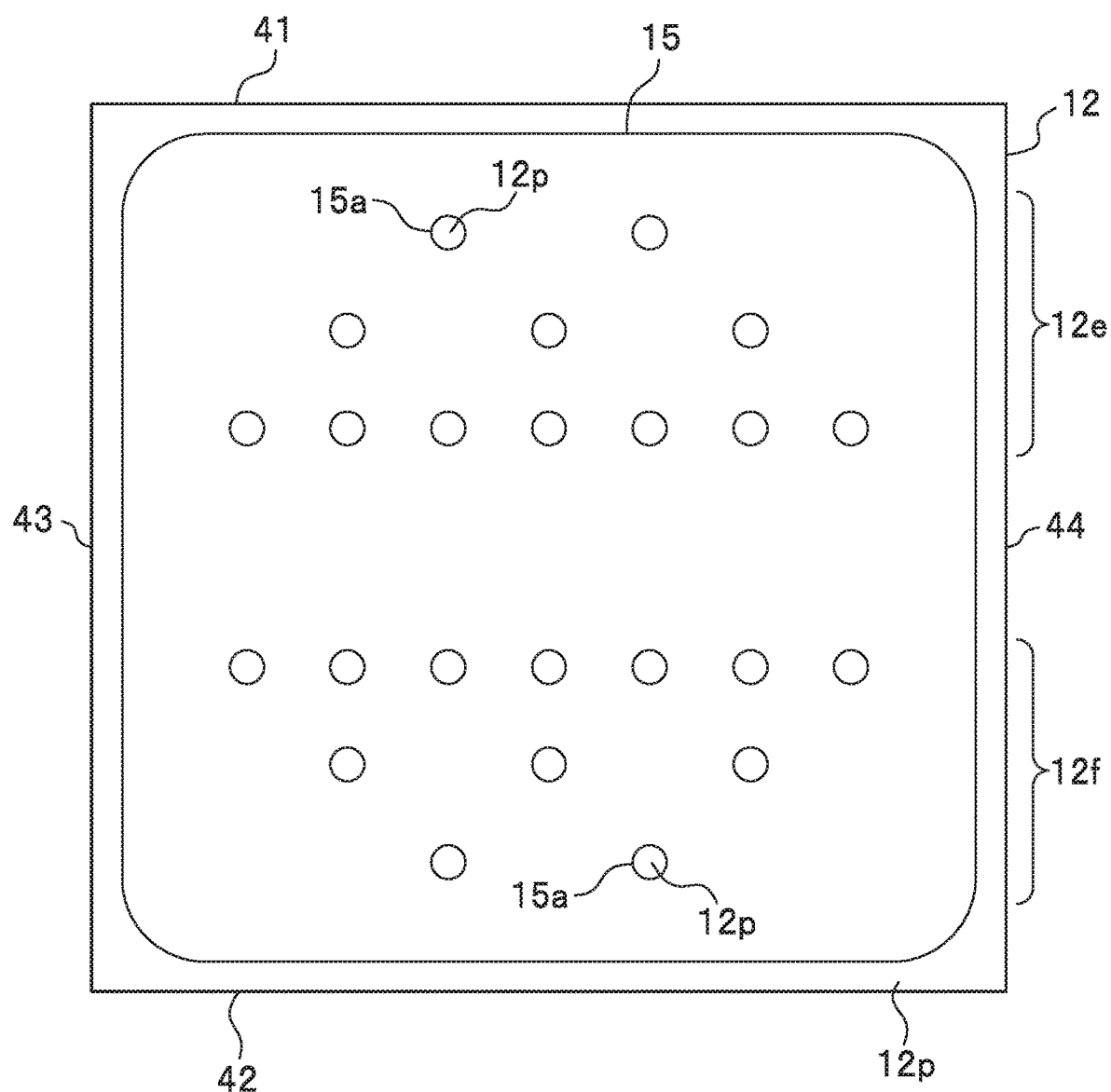
FIG. 8 is a schematic plan view for illustrating a layered structure of the semiconductor light emitting element according to the first embodiment, showing a region where a cover member is disposed.
Figure 9:
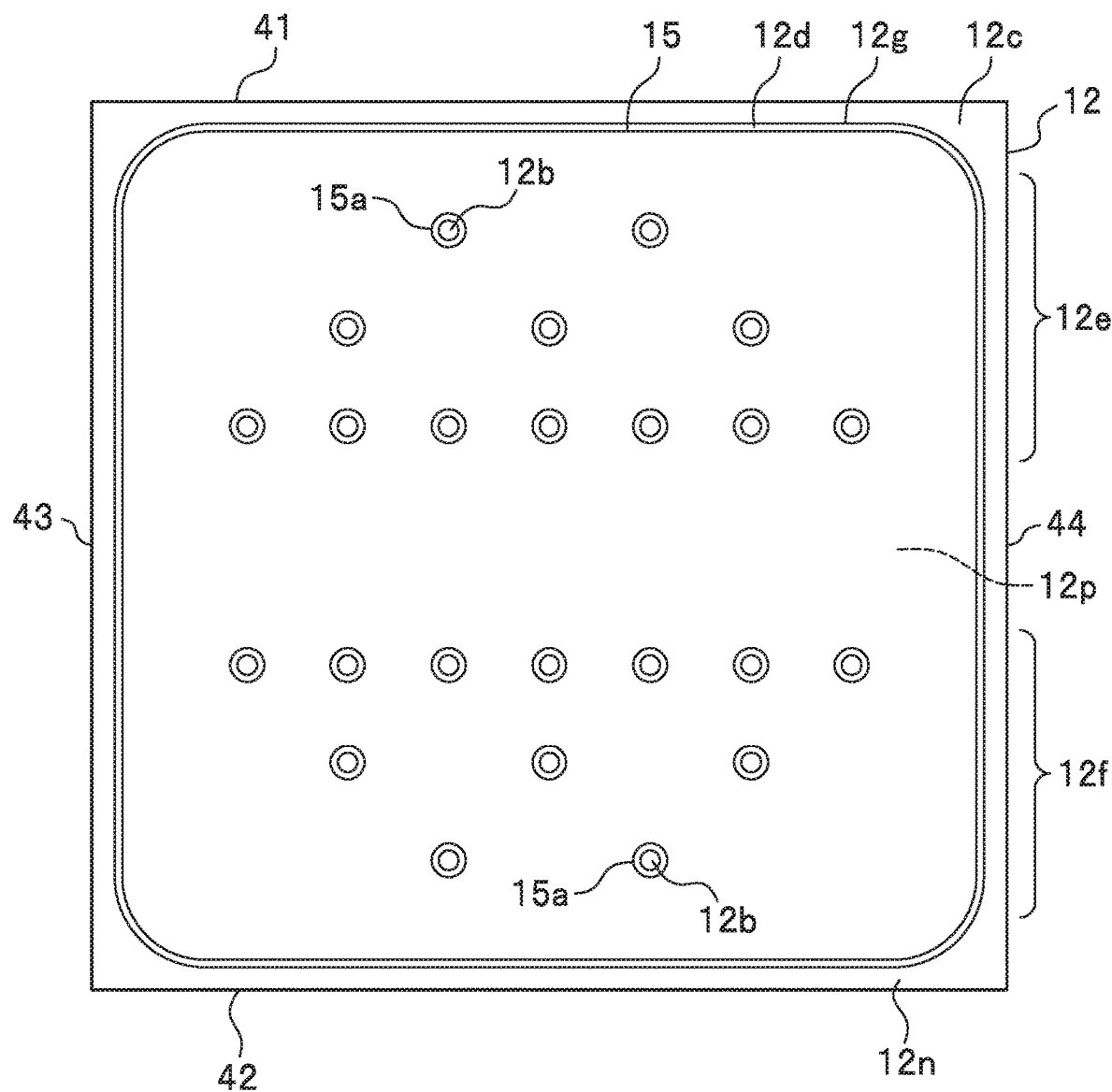
FIG. 9 is a schematic plan view for illustrating the layered structure of the semiconductor light emitting element according to the first embodiment, showing a region where an n-side semiconductor layer and a p-side semiconductor layer are disposed.
Figure 10:
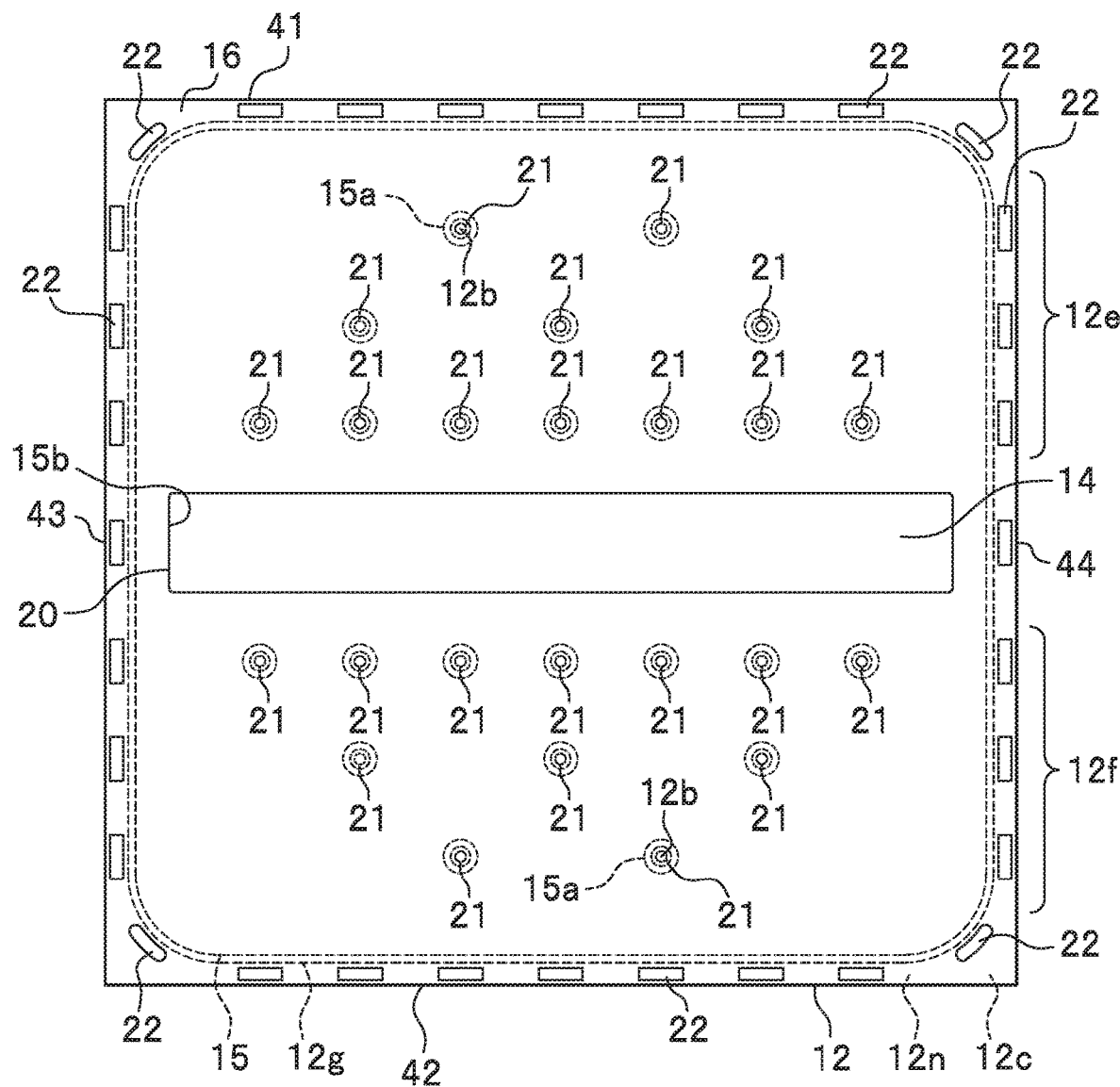
FIG. 10 is a schematic plan view for illustrating the layered structure of the semiconductor light emitting element according to the first embodiment, showing a region where an insulating film is disposed.
Figure 12:
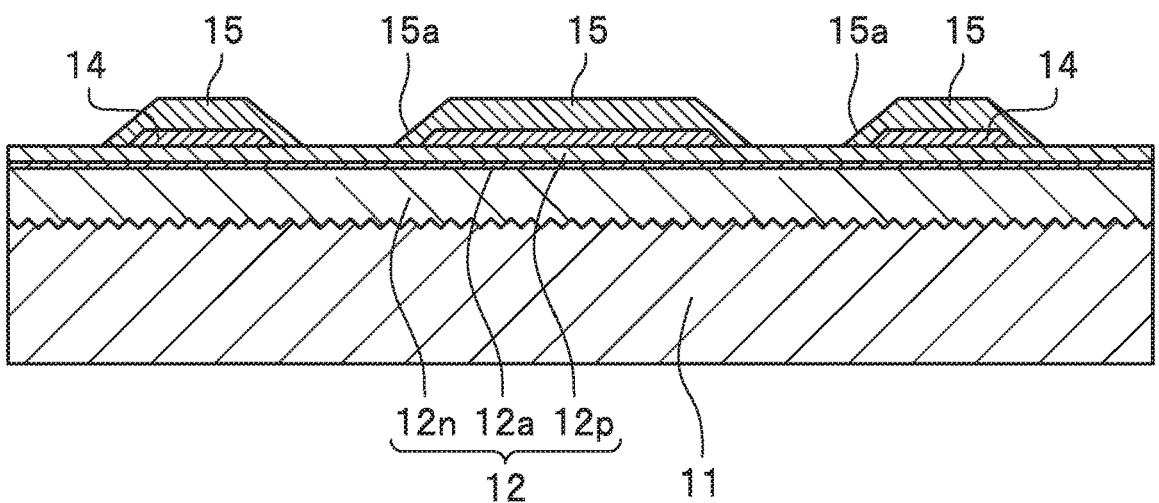
FIG. 12 is a schematic cross-sectional view illustrating a cover member formed on the electrically conductive member in the method of manufacturing a semiconductor light emitting element.
Figure 13:
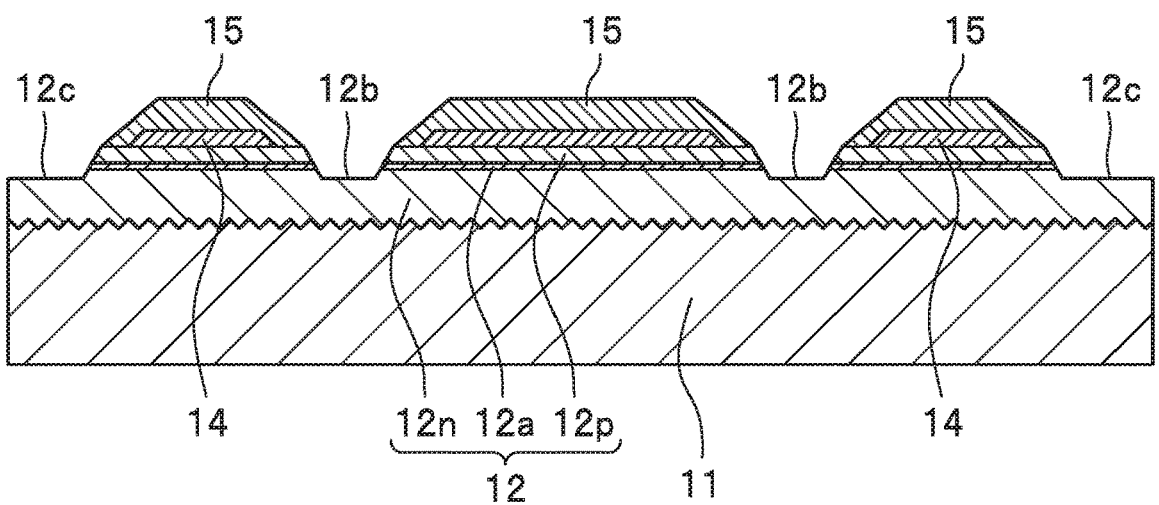
FIG. 13 is a schematic cross-sectional view illustrating the n-side semiconductor layer exposed on the p-side semiconductor layer side in the method of manufacturing a semiconductor light emitting element.
Figure 14:
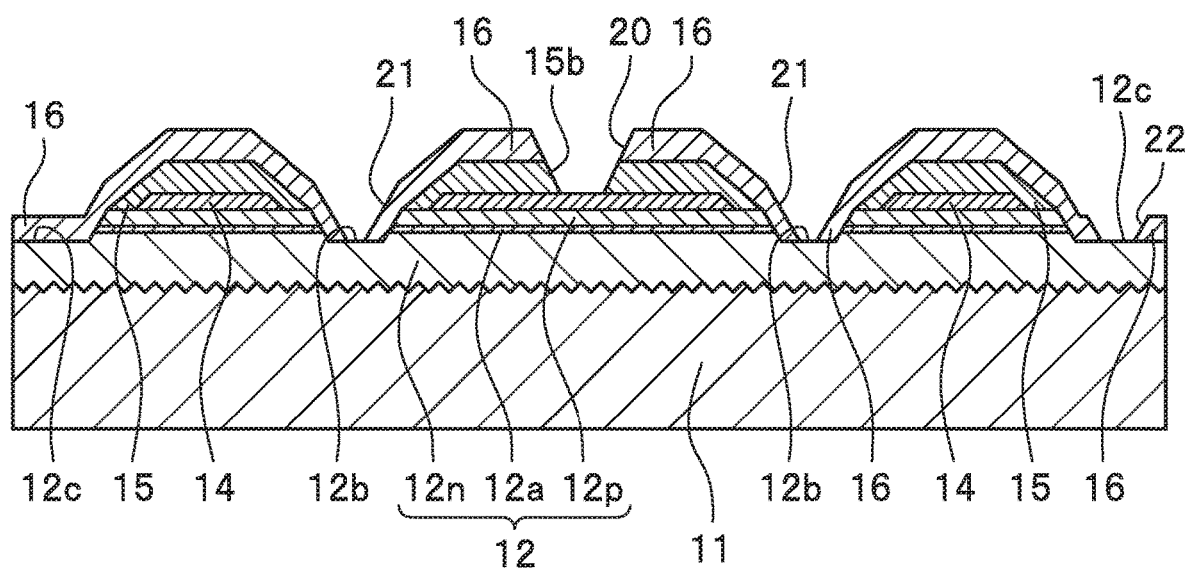
FIG. 14 is a schematic cross-sectional view illustrating the insulating film formed on the cover member in the method of manufacturing a semiconductor light emitting element.

A configuration of a semiconductor light emitting element according to a first embodiment of the present disclosure will be described with reference to FIGS. 1 to 10. The plan views of FIGS. 8 to 10 schematically illustrate states during manufacturing, which correspond to the sectional views of FIGS. 12 to 14 showing a process of manufacturing a semiconductor light emitting element 100, respectively.

Figure 2:
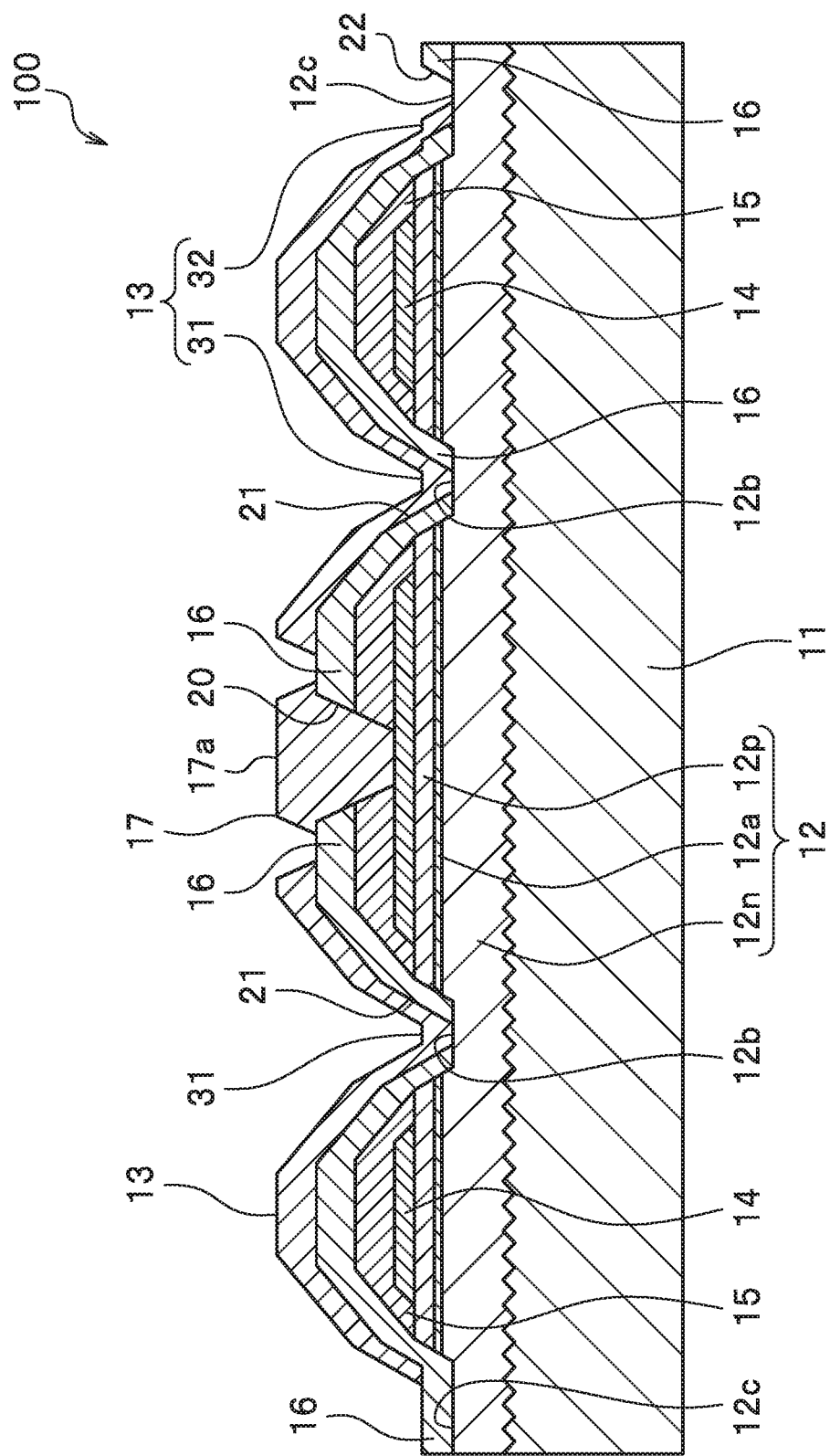
FIG. 2 is a schematic sectional view illustrating a structure of a cross-section taken along line II-II in FIG. 1.

The semiconductor light emitting element 100 according to the present embodiment has a LED (light emitting diode) structure. As shown in FIG. 2, an upper surface of the semiconductor light emitting element 100 is a mounting surface to be electrically connected to the outside. Further, a lower surface of the semiconductor light emitting element 100 is a light extraction surface. The semiconductor light emitting element 100 is prepared in a state of a wafer, which will be described below in detail.

Structures of parts of the semiconductor light emitting element 100 will be sequentially described in detail.

The semiconductor light emitting element 100 includes a base member 11, a semiconductor layered body 12, an n-electrode 13, a p-pad electrode 17 and an electrically conductive member 14 as a p-electrode, a cover member 15, and an insulating film 16. The p-electrode includes the p-pad electrode 17 and the electrically conductive member 14.

Base Member 11

For the base member 11, a substrate material that allows a semiconductor to be epitaxially grown on a principal surface of the base member 11 can be used, and the base member 11 may have any appropriate size, thickness and the like. Examples of the substrate material include insulating substrates such as sapphire and spinel ($MgAl_2O_4$) in which a C-surface, an R-surface, or an A-surface is a principal surface, and silicon carbide (SiC), silicon, Si, GaAs and diamond. In the present embodiment, it is preferable to use a sapphire substrate having light-transmissivity from the viewpoint of improving the light extraction efficiency of the semiconductor light emitting element 100. The base member 11 may have irregularities at a principal surface thereof. When the principal surface of the base member 11 has irregularities, light from an active layer 12a can be scattered on the irregularities, which allows for improving light extraction efficiency.

Semiconductor Layered Body 12

The semiconductor layered body 12 is a layered body stacked on the base member 11, and includes an n-side semiconductor layer 12n, the active layer 12a and a p-side semiconductor layer 12p in this order from the base member 11 side. The p-side semiconductor layer 12p and the active layer 12a are provided in an inner region excluding an outer peripheral region 12c of the n-side semiconductor layer 12n. In the plan views of FIG. 1, etc., a boundary between the inner region and the outer peripheral region 12c is provided with a reference numeral 12g. In the description below, a region located inward of the boundary provided with the reference numeral 12g is referred to as an "inner region 12g".

For the n-side semiconductor layer 12n, the active layer 12a and the p-side semiconductor layer 12p, semiconductors such as $In_XAlYGa_{1-X-Y}N$ ($0 \leq X$, $0 \leq Y$, $X+Y \leq 1$) are preferably used. In addition, each of these semiconductor layers may have a single-layer structure, but may be a layered structure of layers with different composition, thickness and the like, or may have a superlattice structure, or the like. In particular, the active layer 12a has a single-quantum well structure or a multi-quantum well structure.

The semiconductor layered body 12 has a substantially rectangular shape in a top view, and has hole portions 12b and an outer peripheral region 12c as shown in FIGS. 2 and 9. FIG. 9 is a plan view after a step of exposing an n-side semiconductor layer as described below (see FIG. 13).

The hole portions 12b of the semiconductor layered body 12 (see FIGS. 9 and 10) are provided in a region located inward of the outer peripheral region 12c. The arrangement of the hole portions 12b is as in the arrangement of a first n-contact portion 31 as described below (see FIGS. 6 and 7). Therefore, the arrangement of the hole portions 12b will be described below as the arrangement of the first n-contact portion 31. Each hole portion 12b will be described below in detail.

In each hole portion 12b, the p-side semiconductor layer 12p, the active layer 12a and a part of the n-side semiconductor layer 12n are removed from the top of the n-side semiconductor layer 12n. On the upward-facing surface of each hole portion 12b, the n-side semiconductor layer 12n is exposed at a part where the p-side semiconductor layer 12p and the active layer 12a are removed. The lateral surface of each hole portion 12b is covered with the insulating film 16. In addition, the upward-facing surface of the hole portion 12b is partially covered with the insulating film 16 such that the insulating film 16 forms a circular ring shape, and a portion of the n-electrode 13 is located inward of the circular ring shape. The n-electrode 13 and the n-side semiconductor layer 12n are in contact with each other and electrically connected to each other through the first n-side opening 21 of the insulating film 16 provided at a part of the upward-facing surface of the hole portion 12b. The hole portion 12b may have a circular shape or an elliptic shape in a top view.

When each of the hole portions 12b has a circular shape in a top view, each hole portion 12b can have an appropriate diameter according to the size of the semiconductor layered body 12.

Reduction in the diameter of the hole portions 12b allows for reducing a region where the active layer 12a or the like is partially removed, so that the light emitting region can be expanded.

Increase in the diameter of the hole portions 12b allows for increasing the contact area between the n-electrode 13 and the n-side semiconductor layer 12n, so that rising of the forward voltage Vf can be reduced.

The lower limit of the diameter of each hole portion 12b can be selected so that the hole portions 12b can be accurately formed. In addition, the upper limit of the diameter of each hole portion 12b can be selected so that desired light emission can be maintained even when the active layer 12a or the like is partially removed for providing the hole portions 12b.

The outer peripheral region 12c of the semiconductor layered body 12 is a region along the boundary lines between adjacent ones of the semiconductor light emitting elements 100 in a wafer state, and is a remaining region of a region having served as a cutting margin in singulation of the semiconductor light emitting element 100 in a wafer state. The remaining region is a margin part located outward of the contour line of the n-electrode 13 in a top view. The region serving as a cutting margin, including a region to be the remaining region, in manufacturing of the semiconductor light emitting element 100 is also called a "street", and is used to singulate the semiconductor light emitting element 100 in a wafer state. The street is formed such that the outer peripheral region 12c has a predetermined width.

At the outer peripheral region 12c, the p-side semiconductor layer 12p and the active layer 12a are not provided, and the n-side semiconductor layer 12n is exposed. In the description below, the outer peripheral region 12c of the semiconductor layered body 12 is also referred to as an "outer peripheral region 12c of the n-side semiconductor layer 12n".

In the semiconductor light emitting element 100, the lateral surfaces of the p-side semiconductor layer 12p and the active layer 12a, which are exposed by forming the outer peripheral region 12c of the semiconductor layered body 12, are covered with the insulating film 16. In addition, the outer peripheral region 12c of the semiconductor layered body 12 is covered with the n-electrode 13 and the insulating film 16, but is partially exposed.

Electrically Conductive Member 14

As shown in FIG. 2, the electrically conductive member 14 can be provided covering the upper surface of the p-side semiconductor layer 12p. The electrically conductive member 14 defined an opening at positions corresponding to regions having hole portions 12b of the n-side semiconductor layer 12n.

The electrically conductive member 14 can diffuse a current supplied through the p-pad electrode 17 to the p-side semiconductor layer 12p. Further, the electrically conductive member 14 has a high light-reflectance, and may be used as a layer which reflects light emitted by the semiconductor light emitting element 100 downward to a light extraction surface.

For the electrically conductive member 14, an electrically-conductive and light-reflective metal material can be used. For example, Ag, Al, Ni, Ti, Pt, or an alloy containing one or more of these metals as a main component can be used. Further, for the electrically conductive member 14, a single layer or a layered body of these metal materials can be used.

Cover Member 15

As shown in FIGS. 2 and 8, the cover member 15 is provided covering a part of the upper surface and the lateral surface of the electrically conductive member 14. FIG. 8 is a schematic plan view after a step of forming a cover member as described below (see FIG. 12). Under the cover member 15, the electrically conductive member 14 having a size smaller than that of the outer shape of the cover member 15 and having the same shape as the outer shape of the cover member is disposed. The cover member 15 has an opening 15a formed at a position corresponding to a region having the hole portion 12b of the n-side semiconductor layer 12n. Further, the cover member 15 can be omitted.

As shown in FIGS. 10 and 14, the cover member 15 has an opening 15b formed at a position corresponding to a region provided with the p-pad electrode 17. FIG. 14 shows an arrangement of the cover member 15 formed under the insulating member 16 in a state after the step of forming an insulating film as described below. The p-pad electrode 17 is disposed in the opening 15b in the cover member 15 and a p-side opening 20 in the insulating film 16, and is in contact with the electrically conductive member 14, so that the p-pad electrode 17 is electrically connected to the electrically conductive member 14.

The cover member 15 can function as a barrier layer for preventing migration of a metal material that forms the electrically conductive member 14. For the cover member 15, a metal oxide or metal nitride having barrier property can be used, for example, an oxide or nitride of at least one selected from the group consisting of Si, Ti, Zr, Nb, Ta and Al can be used.

The cover member 15 may be a single body made of only a metal. For example, Au can be used. The cover member 15 may be made of alloy. For example, AlCu alloy or the like can be used. Further, the cover member 15 may be a single layer or a layered body including these metals. In the present embodiment, a single-layer of SiN, which can prevent entry of moisture into the electrically conductive member from outside and highly prevent migration, is used as the cover member 15.

Insulating Film 16

The insulating film 16 is an interlayer insulating film disposed on the semiconductor layered body 12, and functions as a protective film and an antistatic film for the semiconductor light emitting element 100. For the insulating film 16, a metal oxide or a metal nitride can be used, and for example, an oxide or nitride of at least one selected from the group consisting of Si, Ti, Zr, Nb, Ta and Al can be preferably used. For the insulating film 16, a DBR (Distributed Bragg Reflector) film in which two or more light-transmissive dielectric materials having different refractive indices are stacked may be used.

As shown in FIGS. 2 and 10, the insulating film 16 is disposed on the upper surface and the lateral surface of the cover member 15, and the upper surface of the semiconductor layered body 12 and lateral surfaces defining the hole portions 12b of the semiconductor layered body 12. The insulating film 16 is also located on a part of the outer peripheral region 12c of the n-side semiconductor layer 12n. The insulating film 16 defines the p-side opening 20, a plurality of first n-side openings 21 and a plurality of second n-side openings 22 above the semiconductor layered body 12. FIG. 10 is a plan view after the step of forming the insulating film (FIG. 14) described below.

The insulating film 16 defines the p-side opening 20 above the p-side semiconductor layer 12p. The p-side opening 20 is located in a region provided with a p-contact portion 17a (see FIG. 2), and has a rectangular shape elongated in a direction parallel to one side 41 (i.e., first side 41) of the semiconductor layered body 12 in FIG. 10. The arrangement of the p-side opening 20 in a top view is similar to the arrangement of the opening 15b of the cover member 15 (see FIG. 8). The size and the shape of the p-side opening 20 are not limited to those described above.

In addition, the insulating film 16 defines each first n-side opening 21 on the upward-facing surface of a respective one of the hole portions 12b in the n-side semiconductor layer 12n in the inner region 12g. Therefore, the arrangement of the first n-side openings 21 is similar to the arrangement of the hole portions 12b. Each first n-side opening 21 has, for example, a circular shape at the upward-facing surface of a respective one of the hole portions 12b. The size and the shape of the first n-side openings 21 are not limited to those described above, and the first n-side openings 21 may have varied sizes and/or varied shapes.

Figure 6:
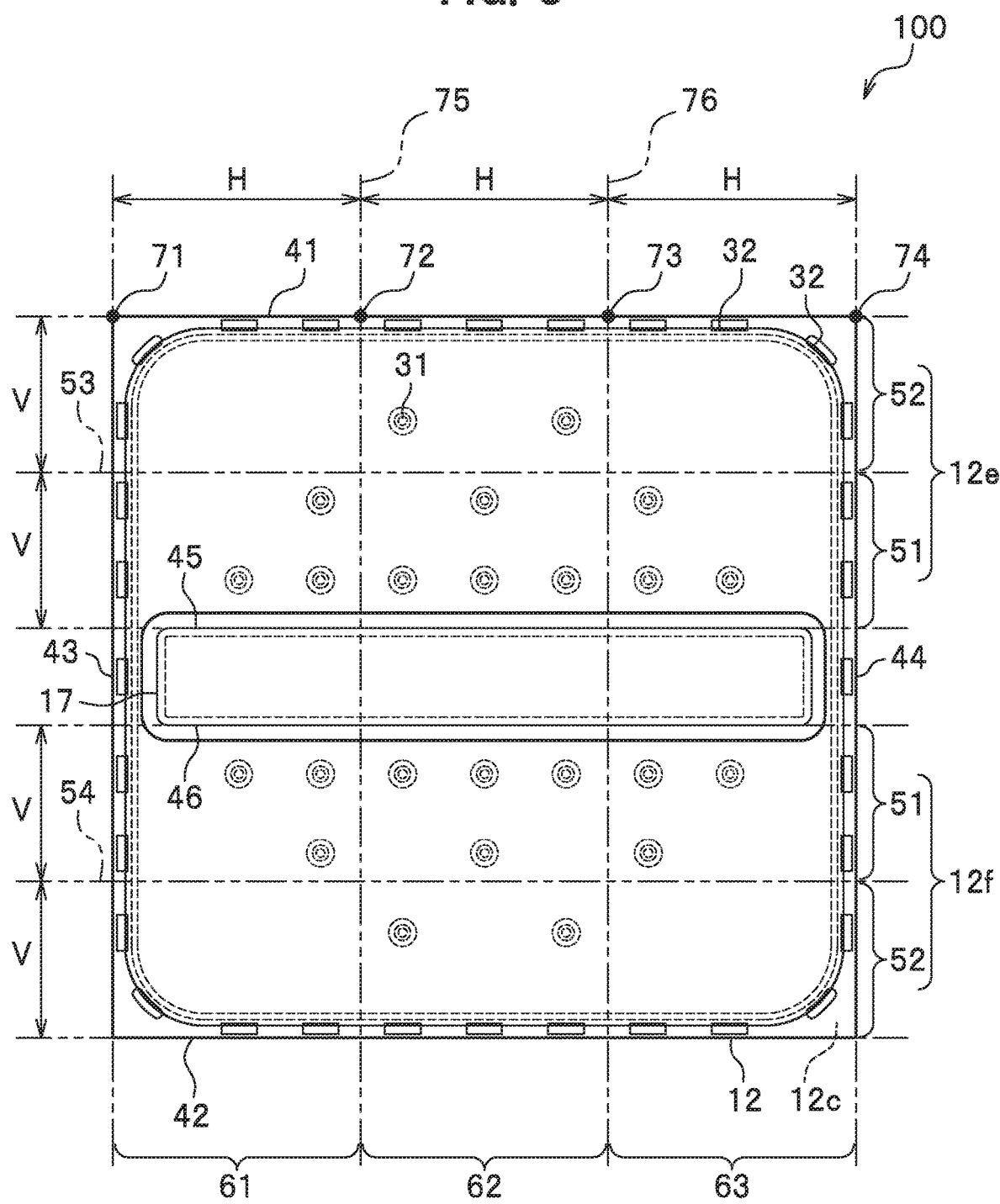
FIG. 6 is a plan view schematically illustrating a distribution of a first n-contact portion.

In addition, the insulating film 16 defines the second n-side openings 22 at the outer peripheral region 12c of the n-side semiconductor layer 12n. The second n-side openings 22 are dispersedly located at at least four corners of the outer peripheral region 12c. In the present embodiment, a plurality of second n-side openings 22 are located at equal intervals on the outer peripheral region 12c between adjacent two of four corners, together with second n-side openings 22 at the four corners of the outer peripheral region 12c. For example, in the present embodiment, seven second n-side openings 22 are formed on each of sides 41 to 44 of the outer peripheral region 12c between the four corners as shown in FIG. 1 and FIG. 6. Each second n-side opening 22 has, for example, a strip shape. The size and the shape of the second n-side openings 22 are not limited to those described above, and second n-side openings 22 may have varied sizes and/or shapes.

p-Pad Electrode 17 and n-Electrode 13

In a top view, the p-pad electrode 17 is disposed in a region including a central portion of the semiconductor layered body 12, and the n-electrode 13 is disposed surrounding the periphery of the p-pad electrode 17.

The p-pad electrode 17 is a pad electrode on the p-side of the semiconductor light emitting element 100. As shown in FIG. 2, the p-pad electrode 17 is electrically connected with the p-side semiconductor layer 12p through the p-side opening 20. In the present embodiment, as shown in FIG. 2, the p-pad electrode 17 includes the p-contact portion 17a electrically connected with the electrically conductive member 14, and is electrically connected with the p-side semiconductor layer 12p via the electrically conductive member 14. The p-contact portion 17a covers the p-side opening 20 and the opening 15b of the cover member 15 (see FIGS. 2 and 14). The p-contact portion 17a and the p-side semiconductor layer 12p are in contact with each other and electrically connected to each other through the p-side opening 20 and the opening 15b. As shown in FIG. 1, in a top view, the p-pad electrode 17 has a substantially rectangular shape as in the p-side opening 20, and has a size slightly larger than that of the p-side opening 20.

The n-electrode 13 is an n-side pad electrode of the semiconductor light emitting element 100. As shown in FIGS. 1 and 2, the n-electrode 13 is disposed extending over the insulating film 16 and the outer peripheral region 12c of the n-side semiconductor layer 12n. In addition, the n-electrode 13 has first n-contact portions 31 each electrically connected to the upward-facing surface of a respective one of the hole portions 12b and a second n-contact portion 32 electrically connected to the outer peripheral region 12c.

As shown in FIG. 2, each of the first n-contact portions 31 of the n-electrode is electrically connected with the n-side semiconductor layer 12n through a respective one of the first n-side openings 21 of the insulating film 16. More specifically, each of the first n-contact portions 31 is electrically connected to the n-side semiconductor layer 12n in a region of the upward-facing surface of a respective one of the hole portions 12b provided with a respective one of the first n-side openings 21 of the insulating film 16. With the n-electrode 13 connected to the n-side semiconductor layer 12n at locations over a wide region of a surface of the semiconductor light emitting element 100 as described above, a current supplied through the n-electrode 13 can be diffused over the entirety of the n-side semiconductor layer 12n, so that light emission efficiency can be improved. The arrangement of the first n-contact portions 31 will be described below.

Figure 3:
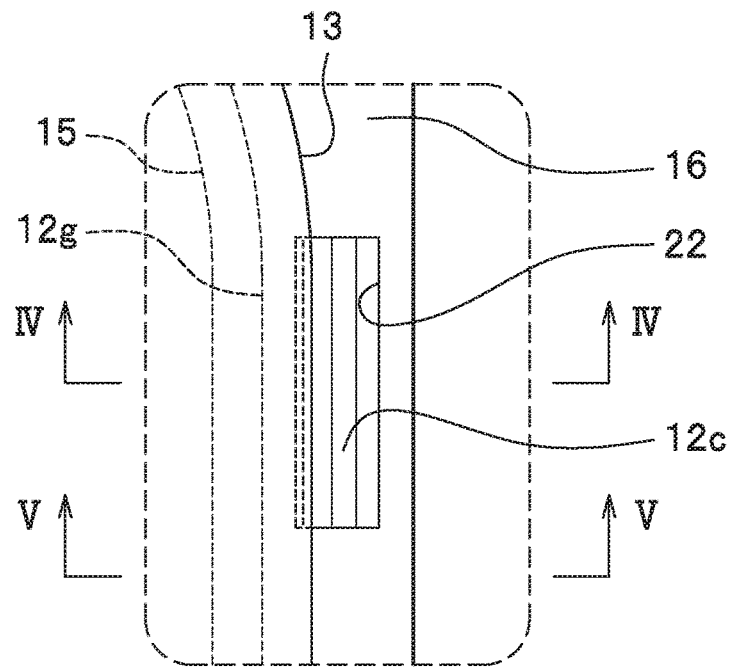
FIG. 3 is a schematic plan view illustrating the configuration of the semiconductor light emitting element according to the first embodiment, showing an enlarged view of a region III indicated by a two-dot chain line in FIG. 1.
Figure 4:
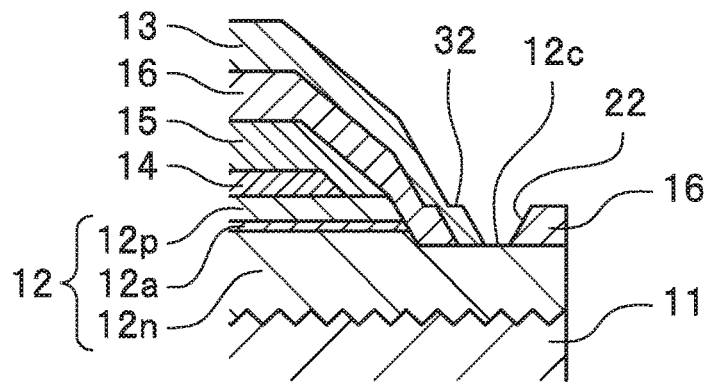
FIG. 4 is a schematic cross-sectional view illustrating the configuration of the semiconductor light emitting element according to the first embodiment, showing a cross-section taken along line IV-IV in FIG. 3.

As shown in FIGS. 2, 3 and 4, each of the second n-contact portions 32 of the n-electrode is electrically connected with the n-side semiconductor layer 12n through a respective one of the second n-side openings 22 of the insulating film 16. With the n-electrode 13 including the second n-contact portions 32, the contact area between the n-electrodes 13 and the n-side semiconductor layer 12n is increased as compared to a case of not including the second n-contact portion 32. Thus, even if the number of first n-contact portions 31 is reduced, increase of the number of second n-contact portions 32 allows for reducing rise of the forward voltage Vf.

Figure 5:
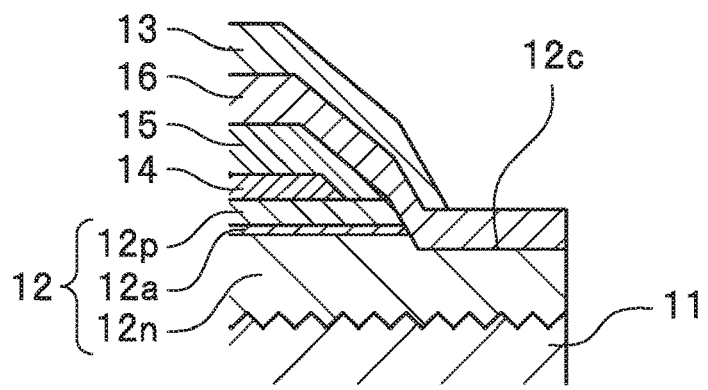
FIG. 5 is a schematic cross-sectional view illustrating the configuration of the semiconductor light emitting element according to the first embodiment, showing a cross-section taken along line V-V in FIG. 3.

As shown in FIG. 5, a portion of the insulating film 16 is located on a portion of the outer peripheral region 12c, where the second n-side openings 22 are not formed, of the n-side semiconductor layer 12n.

Each of the second n-contact portions 32 is electrically connected with the n-side semiconductor layer 12n through a respective one of the second n-side openings 22 at a respective one of at least four corners of the outer peripheral region 12c. That is, the second n-contact portions 32 are dispersedly arranged at the at least four parts of the outer peripheral region 12c, and are located at positions including four corner portions of the rectangle. The active layer 12a of the semiconductor layered body 12 is not present on the outer peripheral region 12c. Thus, even with the second n-contact portions 32 on the outer peripheral region 12c, the area of the active layer 12a is not reduced. In the present embodiment, the area of the first n-contact portions 31 of the inner region 12g is reduced while the second n-contact portions 32 are located at the outer peripheral region 12c, so that it is possible to secure a wide light emitting region while reducing rise of the forward voltage Vf. Further, with the second n-contact portions 32 located at four corners of the outer peripheral region 12c, it is possible to reduce the area of the first n-contact portions 31, which is otherwise required to be disposed in a portion of the inner region 12g close to the four corners of the outer peripheral region 12c. Thus, in the present embodiment, reduction of the light emission output can be prevented, and the current density distribution can be uniform.

In the present embodiment, a plurality of second n-contact portions 32 are dispersedly arranged at equal intervals on the outer peripheral region 12c between adjacent two of four corners, together with second n-contact portions 32 at the four corners, in a top view.

Thus, a plurality of second n-contact portions 32 are disposed at the outer peripheral region 12c, so that it is possible to reduce deterioration of the forward voltage Vf while reducing the area of the first n-contact portions 31 of the inner region 12g. In addition, with a plurality of second n-contact portions 32 dispersedly arranged at equal intervals at the outer peripheral region 12c, unevenness of the current density distribution can be reduced.

Further, with the second n-contact portions 32 that are dispersedly arranged, light is less likely absorbed by an electrode portion provided on the outer peripheral region 12c, as compared to a configuration in which the n-electrode 13 is electrically connected with the n-side semiconductor layer 12n over the entire outer peripheral region 12c. In addition, concentration of the current density on the outer peripheral region 12c can be prevented as compared to a configuration in which the n-electrode 13 is electrically connected with the n-side semiconductor layer 12n over the entire outer peripheral region 12c.

The distribution of the first n-contact portions 31 will be described with reference to FIG. 6.

As shown in FIG. 6, the semiconductor layered body 12 includes an upper side 41, a lower side 42, a left side 43 and a right side 44 in a top view. In the description below, the first side of the semiconductor layered body 12 corresponds to the upper side 41. The direction parallel to the first side 41 of the semiconductor layered body 12 is a lateral direction in FIG. 6. The direction perpendicular to the first side 41 of the semiconductor layered body 12 is an upper-lower direction in FIG. 6. As shown in FIG. 6, the p-pad electrode 17 extends in a direction parallel to the first side 41 of the semiconductor layered body 12 such that two opposite end portions of the p-pad electrode 17 is located in proximity to the outer peripheral region 12c of the n-side semiconductor layer 12n. The p-pad electrode 17 is provided so as to divide the semiconductor layered body 12 into a first region 12e and a second region 12f.

Each of the first region 12e and the second region 12f has a first section 51 and a second section 52, each having an area that is a half of the area of a respective one of the first region 12e and the second region 12f, between the p-pad electrode 17 and the outer peripheral region 12c of the semiconductor layered body 1. The first section 51 is positioned at the p-pad electrode 17 side in a direction perpendicular to the first side 41 of the semiconductor layered body 12, and the second section 52 is positioned on the outer peripheral region 12c side of the semiconductor layered body 12.

In other words, each of the first region 12e and the second region 12f is halved into the first section 51 positioned at the p-pad electrode 17 side and the second section 52 positioned at the outer peripheral region 12c side of the n-side semiconductor layer 12n, in a direction perpendicular to the first side 41 of the semiconductor layered body 12. As shown in FIG. 6, a distance V between an upper side 45 of the p-pad electrode 17 and a boundary line 53 between the first section 51 and the second section 52 of the first region 12e is substantially equal to a distance V between the boundary line 53 and the first side 41 of the outer peripheral region 12c of the semiconductor layered body 12 facing the upper side 45 of the p-pad electrode 17. In addition, a distance V between a lower side 46 of the p-pad electrode 17 and a boundary line 54 between the first section 51 and the second section 52 of the second region 12f is equal to a distance V between the boundary line 54 and the lower side 42 of the outer peripheral region 12c of the semiconductor layered body 12 facing the lower side 46 of the p-pad electrode 17. Demarcation into the first section 51 and the second section 52 as described herein is for ease of understanding of the distribution of the first n-contact portions 31. Thus, each of the first region 12e and the second region 12f is not actually divided into the first section 51 and the second section 52, and the boundary lines 53 and 54 are imaginary lines.

In addition, each of the second sections 52 of the first region 12e and the second region 12f includes a first segment 61, a second segment 62 and a third segment 63, each having an area that is one-third of the area of a respective one of the first region 12e and the second region 12f, in a direction parallel to the first side 41 of the semiconductor layered body 12. The second segment 62 is positioned between the first segment 61 and the third segment 63. In other words, each of the second sections 52 of the first region 12e and the second region 12f is trisected into the first segment 61, the third segment 63 and the second segment 62 positioned between the first segment 61 and the third segment 63, in a direction parallel to the first side 41 of the semiconductor layered body 12. As shown in FIG. 6, points 72 and 73 trisects the first side 41 of the semiconductor layered body 12. That is, a distance H between one end 71 of the first side 41 and the point 72, a distance H between the point 72 and the point 73 and a distance H between the point 73 and the other end 74 of the first side 41 are equal to one another. A boundary line 75 between the first segment 61 and the second segment 62 is orthogonal to the first side 41 of the semiconductor layered body 12, and passes through the point 72 dividing the first side 41 of the semiconductor layered body 12 into three equal parts. A boundary line 76 between the second segment 62 and the third segment 63 is orthogonal to the first side 41 of the semiconductor layered body 12, and passes through the point 73 dividing the first side 41 of the semiconductor layered body 12 into three equal parts.

Demarcation into the first segment 61, the second segment 62 and the third segment 63 as described herein is for ease of understanding of the distribution of the first n-contact portions 31. Thus, the second section 52 of each of the first region 12e and the second region 12f is not actually divided, and the boundary lines 75 and 76 are imaginary lines. Further, the semiconductor layered body 12 may have slightly rounded corners rather than having a strict rectangular shape as shown in FIG. 6. In this case, points dividing the first side 41 into three equal parts can be determined using an intersection of the first side 41 and the left side 43 instead of one end 71 of the first side 41, and using an intersection of the first side 41 and the right side 44 instead of the other end 74 of the first side 41.

As shown in FIG. 6, the area of the first n-contact portions 31 in the first sections 51 of the first region 12e and the second region 12f is larger than the area of the first n-contact portions 31 in the second sections 52 of the first region 12e and the second region 12f. As used herein, the expression "the area of the first n-contact portions 31" refers to the total of the areas of a plurality of n-contact portions 31 in a plan view. The area of each first n-contact portion 31 in a top view may be equal to the area of a respective one of the first n-side opening 21 of the insulating film 16, or may be equal to the area of the upward-facing surface of a respective one of the hole portions 12b. Further, the area of each first n-contact portion 31 in a top view may be equal to the area of the opening 15a of the cover member 15. In addition, when a plurality of first n-contact portions 31 has the same shape and size as in the present embodiment, the area of the first n-contact portion 31 corresponds to the number of first n-contact portions 31. More specifically, for example, as shown in FIG. 6, in the first region 12e, ten first n-contact portions 31 are located in the first section 51, and two first n-contact portions 31 are located in the second section 52. Thus, the area of the first n-contact portion 31 in the first section 51 is 5 times the area of the first n-contact portion 31 in the second section 52. The same applies for the second region 12f.

As shown in FIG. 6, the area of the first n-contact portions 31 in the second segments 62 of the first region 12e and the second region 12f is larger than the area of the first n-contact portions 31 in each of the first segments 61 and the third segments 63 of the first region 12e and the second region 12f. More specifically, for example, as shown in FIG. 6, in the first section 51 of the first region 12e, four first n-contact portions 31 are located in the second segment 62, and three first n-contact portions 31 are located in each of the first segment 61 and the third segment 63. In addition, in the second section 52 of the first region 12e, two first n-contact portions 31 are located in the second segment 62, and no first n-contact portion 31 is located in the first segment 61 and the third segment 63. The same applies for the second region 12f.

The total of the areas of a plurality of second n-contact portions 32 is preferably larger than the total of the areas of a plurality of first n-contact portions 31 in a top view. Increase of the area of the second-n-contact portions 32 disposed on the outer peripheral region 12c allows for preventing increase of the forward voltage Vf while decreasing the area of the first n-contact portions 31 of the inner region 12g.

It is preferable that, in a top view, the plurality of first n-contact portions 31 has the same shape and the same size, and the number of the plurality of first n-contact portions 31 is reduced along with increase in distance from the p-pad electrode 17 in the first region 12e and the second region 12f. As shown in FIG. 6, the number of first n-contact portions 31 disposed in parallel to the first side 41 of the semiconductor layered body 12 is reduced along with increase in distance from the p-pad electrode 17 in the first region 12e and the second region 12f. More specifically, for example, in the first region 12e, seven first n-contact portions 31 are provided in a row that is the closest to the p-pad electrode 17. In addition, three first n-contact portions 31 are provided in a row that is the second closest to the p-pad electrode 17. Further, two first n-contact portions 31 are provided in a row that is the third closest to the p-pad electrode 17. In addition, in the second region 12f, the first n-contact portions 31 are provided in the same arrangement as in the first region 12e, with the p-pad electrode 17 as a symmetric axis. Thus, a greater number of first n-contact portions 31 having the same shape and the same size are disposed on the p-pad electrode 17 side, and a smaller number of such first n-contact portions 31 are disposed on a side closer to the four corners of the outer peripheral region 12c, so that unevenness of the current density distribution can be reduced.

Figure 7:
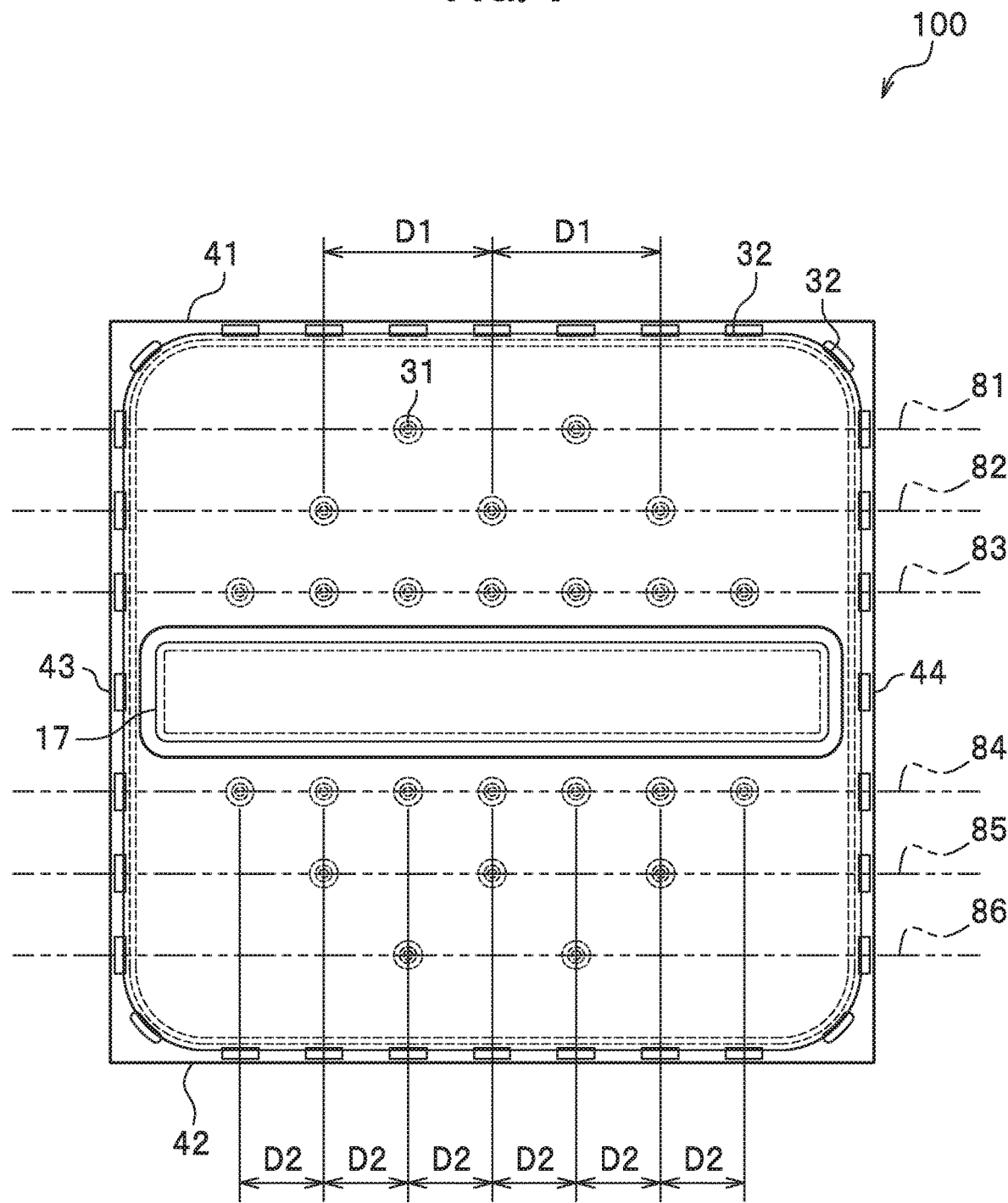
FIG. 7 is a plan view schematically illustrating an arrangement of the first n-contact portion.

Further, it is preferable that, as shown in FIG. 7, a plurality of first n-contact portions 31 are arranged on a plurality of lines 81 to 86 parallel to the first side 41 of the semiconductor layered body 12, and a plurality of first n-contact portions 31 arranged on at least one of a plurality of lines 81 to 86 are arranged at equal intervals in a top view. More specifically, for example, in the first region 12e, each of distances between adjacent first n-contact portions 31 disposed on the line 82 is D1. In addition, for example, in the second region 12f, each of distances between adjacent first n-contact portions 31 disposed on the line 84 is D2. Thus, a plurality of first n-contact portions 31 in the inner region 12g are arranged at equal intervals, so that unevenness in the current density distribution can be reduced. The plurality of lines 81 to 86 are imaginary lines for easy understanding of the arrangement of the first n-contact portion 31, and the lines 81 to 86 are not actually drawn.

In addition, for example, the first n-contact portions 31 are arranged such that an isosceles trapezoid is formed by lines connecting an outermost periphery of a plurality of first n-contact portions 31 in each of the first region 12e and the second region 12f. The isosceles trapezoid in each of the first region 12e and the second region 12f have a lower bottom at the p-pad electrode 17 side. With the first n-contact portions 31 arranged such that the number of first n-contact portions 31 is gradually reduced from the lower bottom toward the upper bottom of each of the isosceles trapezoids, it is possible to reduce unevenness of the current density distribution and reduce reduction of the light emission output.

Further, the p-pad electrode 17 and the n-electrode 13 also function as a heat transmission path for dissipating heat generated by the semiconductor light emitting element 100. The p-pad electrode 17 and the n-electrode 13 can be formed by, for example, using a sputtering method or an electroplating method. For the p-pad electrode 17 and the n-electrode 13, metal materials can be used, and for example, elementary metals such as Ag, Al, Ni, Rh, Au, Cu, Ti, Pt, Pd, Mo, Cr and W or alloys containing one or more of these metals as a main component can be preferably used. When an alloy is used, for example, the alloy may contain a nonmetal element such as Si as a composition element, for example, AlSiCu alloy (hereinafter, referred to as ASC). Further, for the p-pad electrode 17 and the n-electrode 13, a single layer or a layered body of these metal materials can be used.

In the semiconductor light emitting element 100 having the configuration described above, the n-electrode 13 includes the second n-contact portions 32 as shown in FIG. 1. Adjustment of the number, the position, the area and the like of the second n-contact portions 32 allows for easily securing the contact area between the n-electrode 13 and the n-side semiconductor layer 12n without increasing the number of first n-contact portions 31. Thus, it is possible to reduce rise of the forward voltage Vf of the semiconductor light emitting element 100 and improve the light emission output.

Operation of Semiconductor Light Emitting Element

Next, the operation of the semiconductor light emitting element 100 will be described with reference to FIGS. 1 and 2.

In the semiconductor light emitting element 100, a current is supplied between the n-electrode 13 and the p-pad electrode 17 when an external power source is connected to the n-electrode 13 and the p-pad electrode 17 through a mounting substrate. When the current is supplied between the n-electrode 13 and the p-pad electrode 17, the active layer 12a of the semiconductor light emitting element 100 emits light.

The light emitted by the active layer 12a of the semiconductor light emitting element 100 is propagated in the semiconductor layered body 12, is emitted from the lower surface or the lateral surfaces (see FIG. 2) of the semiconductor light emitting element 100, and is extracted outside. When the electrically conductive member 14 functions as a light-reflecting layer, light propagated upward in the semiconductor light emitting element 100 is reflected by the electrically conductive member, is emitted from the lower surface of the semiconductor light emitting element 100, and extracted outside.

Method of Manufacturing Semiconductor Light Emitting Element

Next, a method of manufacturing the semiconductor light emitting element 100 shown in FIG. 1 will be described with reference to FIGS. 11 to 14 (see FIGS. 1 to 10 as appropriate). The method of manufacturing the semiconductor light emitting element 100 includes a step of forming a semiconductor layered body, a step of forming an electrically conductive member, a step of forming a cover member, exposing an n-side semiconductor layer out, a step of forming an insulating film, a step of forming a pad electrode, and a step of singulating, which are carried out in this order.

In FIGS. 11 to 14, the shapes, sizes and positional relationships of the members may be simplified or exaggerated as appropriate. Further, in manufacturing of the semiconductor light emitting element 100 in a state of a wafer, steps are carried out in a state where many semiconductor light emitting elements are two-dimensionally arranged. Further, as in the cross-sectional view shown in FIG. 2, the cross-sectional view shown in each of FIGS. 11 to 14 is taken along the line II-II in FIG. 1.

First, in the step of forming semiconductor layered body, using the semiconductor material described above, the n-side semiconductor layer 12n, the active layer 12a and the p-side semiconductor layer 12p are sequentially layered on the upper surface of base member 11 made of sapphire or the like, so that the semiconductor layered body 12 is formed. The base member 11 may be polished to reduce a thickness of the base member 11. In addition, a fluorescent material layer, using a resin containing a fluorescent material, may be provided on a back-surface side of the base member 11.

Figure 11:
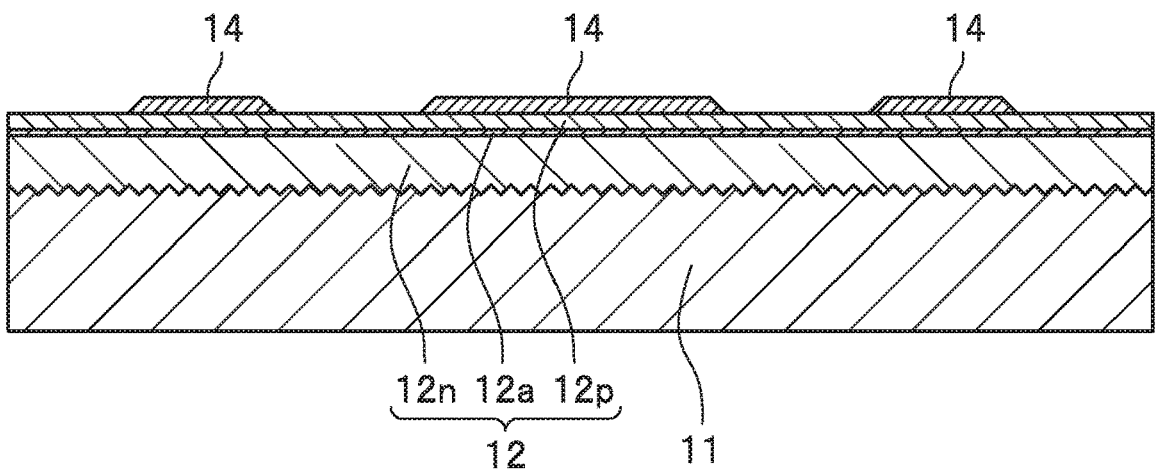
FIG. 11 is a schematic cross-sectional view illustrating an electrically conductive member formed on a semiconductor layered body in a method of manufacturing a semiconductor light emitting element.

Next, in the step of forming electrically conductive member, the electrically conductive member 14 in a predetermined region as shown in FIG. 11. The electrically conductive member 14 can be formed using a lift-off method. That is, a resist pattern having an opening is formed using a photolithography method in a region where the electrically conductive member 14 is disposed, and a metal film having a high reflectance as described above, such as Ag, is then deposited on an entirety of a surface of a wafer using a sputtering method, a vapor deposition method or the like. By removing the resist pattern, the metal film is patterned, so that the electrically conductive member 14 having an opening is formed.

Next, in the step of forming cover member, the cover member 15 is formed so as to cover the upper surface and the lateral surface of the electrically conductive member 14 as shown in FIG. 12. For formation of the cover member 15, a SiN film is deposited on an entirety of a surface of a wafer using, for example, a sputtering method, a vapor deposition method or the like, and thereafter, using a photolithography method, a resist pattern having an opening is formed in a region other than a region where the cover member 15 is disposed. Etching is performed with the resist pattern as a mask to pattern the SiN film, and the resist pattern is then removed to form the cover member 15 having the opening 15a.

Next, in the step of exposing n-side semiconductor layer out, in a region of the semiconductor layered body 12, the p-side semiconductor layer 12p, the active layer 12a, and a portion the n-side semiconductor layer 12n are removed by dry etching to form the hole portions 12b and the outer peripheral region 12c at each of which the n-side semiconductor layer 12n is exposed, as shown in FIG. 13.

The etching mask used in dry etching is formed to cover the cover member 15 using a photolithography method. Thus, the p-side semiconductor layer 12p remains over an area greater than the arrangement region of the cover member 15 by a thickness of the etching mask disposed on the lateral surface of the cover member 15. In other words, each opening of the p-side semiconductor layer 12p (i.e., a boundary between each hole portion 12b and the p-side semiconductor layer 12p) corresponding to a respective one of the hole portions 12b has a size smaller than a size of a respective one of the opening 15a of the cover member 15 (see FIG. 12) by the thickness of the etching mask. In the drawings, the opening of the p-side semiconductor layer 12p is not provided with a reference numeral.

Next, in the step of forming an insulating film, the insulating film 16 defining an opening is formed in a predetermined region using a predetermined insulating material as shown in FIG. 14. The insulating film 16 defines the first n-side openings 21 in the hole portions 12b, and defines the second n-side openings 22 at least four corners of the outer peripheral region 12c in a top view. Further, the insulating film 16 defines the p-side opening 20 on a part of the upper surface of the cover member 15. At this time, the opening 15b is formed on the cover member 15 disposed under a region where the p-side opening 20 is formed. Therefore, the p-side opening 20 has a size substantially equal to that of the opening 15b of the cover member 15. The insulating film 16 can be patterned by, after forming an insulating film over an entirety of a surface of a wafer using a sputtering method or the like, forming a resist pattern that defines an opening in the predetermined region as described above, and etching the insulating film.

Next, in the step of forming a pad-electrode, as shown in FIG. 2, the n-electrode 13 and the p-pad electrode 17 are formed on the insulating film 16 using, for example, a sputtering method. The n-electrode 13 and the p-pad electrode 17 can be patterned using, for example, a lift-off method. At this time, the p-pad electrode 17 is connected to the electrically conductive member 14 through the p-side opening 20 of the insulating film 16 and the opening 15b of the cover member 15. That is, the p-pad electrode 17 is electrically connected to the p-side semiconductor layer 12p through the electrically conductive member 14. In addition, at this time, the first n-contact portions 31 of the n-electrode 13 are connected to the n-side semiconductor layer 12n through the first n-side openings 21 of the insulating film 16. Further, the second n-contact portions 32 of the n-electrode 13 are connected to the n-side semiconductor layer 12n through the second n-side opening 22 of the insulating film 16 in the outer peripheral region 12c of the semiconductor layered body 12. Patterning is performed on the wafer such that the n-electrode 13 is not formed on a region, which is to serve as a cutting margin in the step of singulating, of the outer peripheral region 12c that is a boundary between light emitting elements. Thus, on the wafer, the n-electrodes 13 are separated from each other for each semiconductor light emitting element 100.

Next, in the step of singulating, the wafer is cut along boundary lines using a dicing method or a scribing method to singulate the semiconductor light emitting element 100. As shown in FIG. 2, the lateral surface to be an outer edge of the semiconductor layered body 12 formed by singulation is exposed outside without being covered with any of the insulating film 16, the n-electrode 13 and the p-pad electrode 17. Through the above steps, the semiconductor light emitting element 100 shown in FIG. 1 can be obtained.

Second Embodiment

Figure 15:
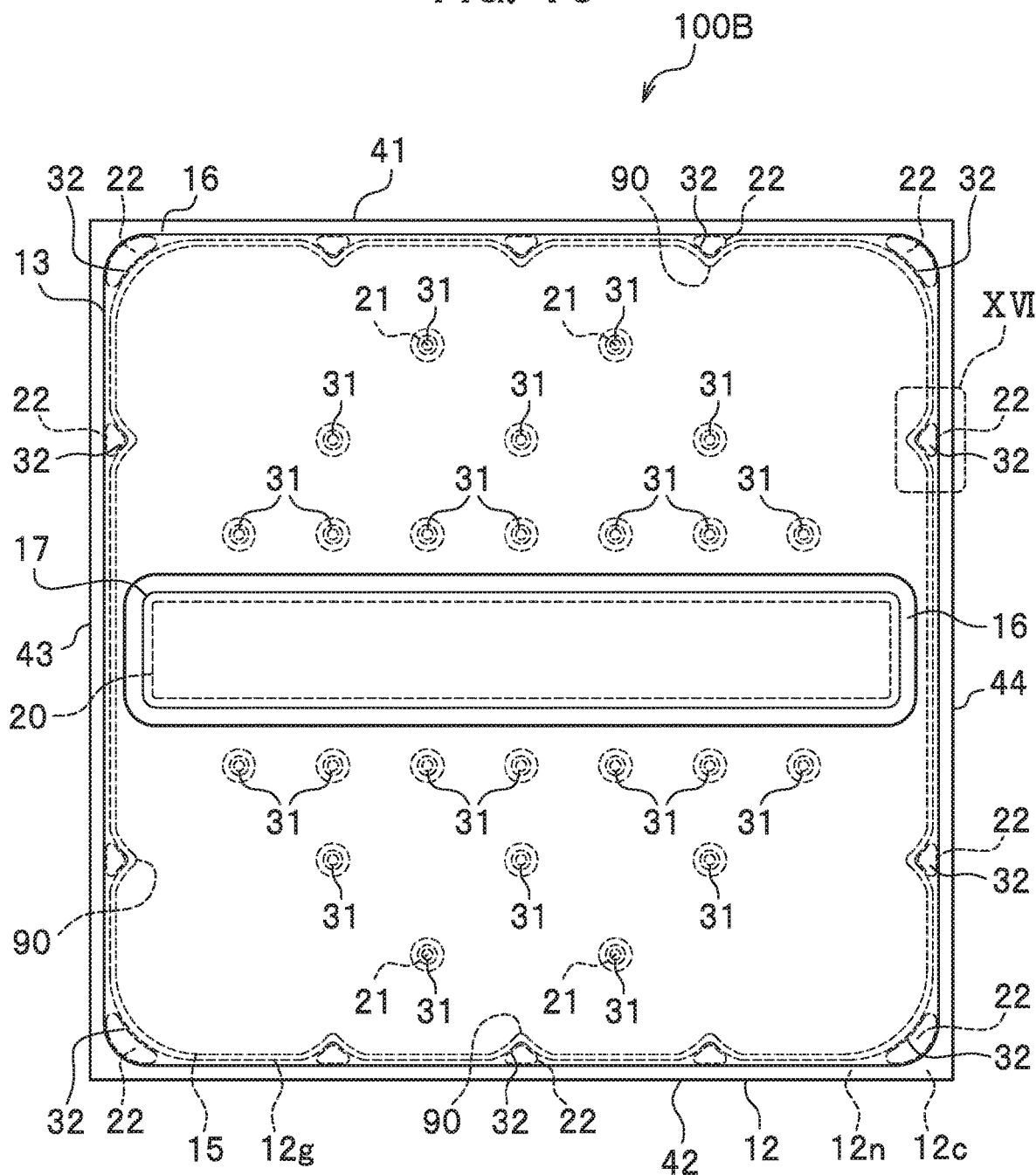
FIG. 15 is a plan view schematically illustrating a configuration of a semiconductor light emitting element according to a second embodiment.

As shown in FIG. 15, a semiconductor light emitting element 100B according to a second embodiment is different from the semiconductor light emitting element 100 according to the first embodiment in shape of the semiconductor layered body 12. Hereinafter, the same configurations as in the semiconductor light emitting element 100 shown in FIG. 1 are provided with the same reference numerals, and descriptions thereof are omitted.

The semiconductor light emitting element 100B is different from the semiconductor light emitting element 100 shown in FIG. 1 in that, in a top view, an outer peripheral region 12c of an n-side semiconductor layer 12n has extending regions 90 extending toward an inner region 12g, an insulating film 16 defines second n-side openings 22 each formed in a respective one of the extending regions 90, and an n-electrode 13 is formed to cover the second n-side openings 22 each defined in a respective one of the extending regions 90.

In the present embodiment, in a top view, the inner region 12g of the n-side semiconductor layer 12n has a substantially rectangular shape, and a plurality of extending regions 90 are located at each side of the inner region 12g. Further, a plurality of second n-side openings 22 are dispersedly arranged on the outer peripheral region 12c between adjacent two of four corners, together with second n-side openings 22 at the four corners of the outer peripheral region 12c. In one example, each of the second n-side openings 22 at the four corners of the outer peripheral region 12c has, for example, a strip shape or a circular shape deformed along a corner portion of the semiconductor layered body 12 having a substantially rectangular shape. Further, each of the second n-side openings 22 dispersedly arranged on the outer peripheral region 12c between adjacent two of the four corners is formed in a respective one of the extending regions 90.

In a portion where the extending region 90 is formed, the outer peripheral region 12c of the n-side semiconductor layer 12n extends toward the inner region 12g. Thus, when the number of extending regions 90, i.e., the number of second n-side openings 22 dispersedly formed on the outer peripheral region 12c between adjacent two of the four corners, is increased, rising of the forward voltage Vf can be suppressed, and further, when the number of second n-side openings 22 dispersedly formed on the outer peripheral region 12c is reduced, the area of an active layer 12a can be maintained. In the outer peripheral region 12c between adjacent two of the four corners, three second n-side openings 22 are formed on each of an upper side 41 and a lower side 42, two second n-side openings 22 are formed on each of a left side 43 and a right side 44. Each of the second n-side openings 22 formed on the outer peripheral region 12c between adjacent two of the four corners has a projecting shape corresponding to the shape of a respective one of the extending regions 90, e.g. a substantially rectangular shape. Each of the extending regions 90 may have a size that allows for maintaining the area of the inner region 12g and forming second n-contact portions 32 in second n-side openings 22 dispersedly formed on the outer peripheral region 12c.

In the present embodiment, as shown in FIGS. 16 and 17, the n-electrode 13 is disposed to cover the second n-side openings 22 each defined in a respective one of the extending regions 90, and each the second n-contact portions 32 of the n-electrode 13 is electrically connected with the n-side semiconductor layer 12n through a respective one of the second n-side openings 22 of the insulating film 16. With this structure, the n-side semiconductor layer 12n is not easily exposed from the n-electrode 13 in the second n-side opening 22 as compared to a case where the second n-side opening 22 is located closer to the sides 41 to 44 than to the extending region 90 in the outer peripheral region 12c. Accordingly, the n-side semiconductor layer 12n can be protected from external factors such as moisture by the n-electrode 13 disposed to cover the second n-side openings 22.

Further, in the example shown in FIG. 15, the n-electrode 13 is disposed to cover the second n-side openings 22 formed at the four corners of the outer peripheral region 12c. Accordingly, in all the second n-side openings 22 formed on the insulating film 16, non-contact regions, where the second n-contact portion 32 and the outer peripheral region 12c (n-side semiconductor layer 12n) are not in contact with each other, can be eliminated. Therefore, in the present embodiment, all the second n-side openings 22 do not include such non-contact regions, so that entry of moisture and the like can be prevented, so that reliability can be improved. A method of manufacturing the semiconductor light emitting element 100B is as in the method described above, and therefore the description thereof is omitted.

While the semiconductor light emitting elements according to certain embodiments of the present disclosure have been described above, the scope of the present invention is not limited to these descriptions, and should be broadly construed on the basis of the descriptions of claims. Further, various changes and modifications made on the basis of these descriptions are within the scope of the present invention.

What is claimed is:

1. A semiconductor light emitting element comprising:
a semiconductor layered body having a substantially rectangular shape in a top view, the semiconductor layered body comprising:
an n-side semiconductor layer comprising:
an outer peripheral region, and
an inner region located inward of outer peripheral region, and
a p-side semiconductor layer disposed above the inner region of the n-side semiconductor layer;
an insulating film defining, on the semiconductor layered body:
a p-side opening above the p-side semiconductor layer,
a plurality of first n-side openings located above the inner region of the n-side semiconductor layer, and
a plurality of second n-side openings located above the outer peripheral region of the n-side semiconductor layer;
an n-electrode disposed extending over the insulating film and the outer peripheral region of the n-side semiconductor layer, and including:
a plurality of first n-contact portions, each electrically connected with the n-side semiconductor layer through a respective one of the first n-side openings, and
a plurality of second n-contact portions, each electrically connected with the n-side semiconductor layer through a respective one of the second n-side openings, at at least four corners of the outer peripheral region of the n-side semiconductor layer; and
a p-pad electrode electrically connected with the p-side semiconductor layer through the p-side opening, wherein the p-pad electrode being disposed in a region including a central portion of the semiconductor layered body in a top view, wherein the p-pad electrode extends in a direction parallel to a first side of the semiconductor layered body such that two opposite ends of the p-pad electrode are located in proximity to the outer peripheral region of the n-side semiconductor layer in a top view, and wherein the p-pad electrode divides the semiconductor layered body into a first region and a second region in a top view,
wherein each of the first region and the second region includes a first section positioned at a p-pad electrode side, and a second section positioned at an outer peripheral region side of the semiconductor layered body between the p-pad electrode and the outer peripheral region of the semiconductor layered body in a direction perpendicular to a first side of the semiconductor layered body, such that each of the first region and the second region is halved into the first section and the second section,
wherein the second section of each of the first region and the second region includes a first segment, a second segment, and a third segment, the second segment being positioned between the first segment and the third segment, such that the second section is trisected into the first, second, and third segments in a direction parallel to the first side of the semiconductor layered body,
wherein an area of the first n-contact portions in the first section of each of the first region and the second region is larger than an area of the first n-contact portions in the second section of a respective one of the first region and the second region, and wherein an area of the first n-contact portions in the second segment of each of the first region and the second region is larger than an area of the first n-contact portions in the first segment and the third segment of a respective one of the first region and the second region.

2. The semiconductor light emitting element according to claim 1, wherein the plurality of second n-contact portions further includes second n-contact portions that are dispersedly arranged at equal intervals on the outer peripheral region of the n-side semiconductor layer between adjacent two of the four corners, together with the second n-contact portions at the four corners.

3. The semiconductor light emitting element according to claim 1, wherein, in a top view, a total of areas of the plurality of the second n-contact portions is larger than a total of areas of the plurality of the first n-contact portions.

4. The semiconductor light emitting element according to claim 2, wherein, in a top view, a total of areas of the plurality of the second n-contact portions is larger than a total of areas of the plurality of the first n-contact portions.

5. The semiconductor light emitting element according to claim 1, wherein:
in a top view, a shape and a size of the plurality of the first n-contact portions are the same, and
a number of the plurality of first n-contact portions is reduced along with an increase in distance from the p-pad electrode in the first region and the second region.

6. The semiconductor light emitting element according to claim 2, wherein:
in a top view, a size and a shape of the plurality of the first n-contact portions is the same, and
a number of the plurality of first n-contact portions is reduced along with increase in distance from the p-pad electrode in the first region and the second region.

7. The semiconductor light emitting element according to claim 3, wherein:
in a top view, a size and a shape of the plurality of the first n-contact portions is the same, and
a number of the plurality of first n-contact portions is reduced along with increase in distance from the p-pad electrode in the first region and the second region.

8. The semiconductor light emitting element according to claim 1, wherein:
the plurality of first n-contact portions are disposed on a plurality of lines that are parallel to the first side of the semiconductor layered body, and
a set of the plurality of first n-contact portions disposed on at least one of the plurality of lines are disposed at equal intervals.

9. The semiconductor light emitting element according to claim 2, wherein:
the plurality of first n-contact portions are disposed on a plurality of lines that are parallel to the first side of the semiconductor layered body, and
a set of the plurality of first n-contact portions disposed on at least one of the plurality of lines are disposed at equal intervals.

10. The semiconductor light emitting element according to claim 3, wherein:
the plurality of first n-contact portions are disposed on a plurality of lines that are parallel to the first side of the semiconductor layered body, and
a set of the plurality of first n-contact portions disposed on at least one of the plurality of lines are disposed at equal intervals.

11. The semiconductor light emitting element according to claim 4, wherein:
- the plurality of first n-contact portions are disposed on a plurality of lines that are parallel to the first side of the semiconductor layered body, and
- a set of the plurality of first n-contact portions disposed on at least one of the plurality of lines are disposed at equal intervals.

12. The semiconductor light emitting element according to claim 1, wherein:
- the outer peripheral region of the n-side semiconductor layer comprises extending regions extending toward the inner region,
- the insulating film defines the plurality of second n-side openings, each formed in a respective one of the extending regions, and
- the n-electrode is disposed to cover the second n-side openings, each defined in a respective one of the extending regions.

13. The semiconductor light emitting element according to claim 2, wherein:
- the outer peripheral region of the n-side semiconductor layer comprises extending regions extending toward the inner region,
- the insulating film defines the plurality of second n-side openings, each formed in a respective one of the extending regions, and
- the n-electrode is disposed to cover the second n-side openings, each defined in a respective one of the extending regions.

14. The semiconductor light emitting element according to claim 3, wherein:
- the outer peripheral region of the n-side semiconductor layer comprises extending regions extending toward the inner region,
- the insulating film defines the plurality of second n-side openings, each formed in a respective one of the extending regions, and
- the n-electrode is disposed to cover the second n-side openings, each defined in a respective one of the extending regions.

15. The semiconductor light emitting element according to claim 4, wherein:
- the outer peripheral region of the n-side semiconductor layer comprises extending regions extending toward the inner region,
- the insulating film defines the plurality of second n-side openings, each formed in a respective one of the extending regions, and
- the n-electrode is disposed to cover the second n-side openings, each defined in a respective one of the extending regions.

16. The semiconductor light emitting element according to claim 5, wherein:
- the outer peripheral region of the n-side semiconductor layer comprises extending regions extending toward the inner region,
- the insulating film defines the plurality of second n-side openings, each formed in a respective one of the extending regions, and
- the n-electrode is disposed to cover the second n-side openings, each defined in a respective one of the extending regions.

* * * * *